(12) United States Patent
Chang et al.

(10) Patent No.: US 9,003,350 B2
(45) Date of Patent: *Apr. 7, 2015

(54) MULTIPLE LEVEL SPINE ROUTING

(71) Applicants: Synopsys Taiwan Co., Ltd., Taipei (TW); Synopsys, Inc., Mountain View, CA (US)

(72) Inventors: Fong-Yuan Chang, Chu-Dong Township (TW); Wei-Shun Chuang, Hsinchu (TW); Sheng-Hsiung Chen, Hsinchu (TW); Hsian-Ho Chang, Miao-Li (TW); Ruey-Shi Rau, Taipei (TW)

(73) Assignees: Synopsys Taiwan Co., Ltd., Hsinchu Hsien (TW); Synopsys, Inc., Mountain View, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/043,689

(22) Filed: Oct. 1, 2013

(65) Prior Publication Data

US 2014/0033158 A1  Jan. 30, 2014

Related U.S. Application Data

(63) Continuation of application No. 13/289,965, filed on Nov. 4, 2011, now Pat. No. 8,959,473.

(60) Provisional application No. 61/417,839, filed on Oct. 29, 2010.

(51) Int. Cl.
*G06F 17/50* (2006.01)

(52) U.S. Cl.
CPC .................... *G06F 17/5077* (2013.01)

(58) Field of Classification Search
CPC .................................................. G06F 17/5077
USPC ................... 716/122, 123, 124, 129, 130, 131
See application file for complete search history.

(56) References Cited

U.S. PATENT DOCUMENTS

| | | | |
|---|---|---|---|
| 4,577,276 A | 3/1986 | Dunlop et al. |
| 5,361,214 A | 11/1994 | Aoki |
| 5,583,788 A | 12/1996 | Kuribayashi |
| 5,659,717 A | 8/1997 | Tse et al. |
| 5,854,752 A | 12/1998 | Agarwal |
| 5,917,729 A | 6/1999 | Naganuma et al. |
| 6,014,507 A | 1/2000 | Fuji |
| 6,161,056 A | 12/2000 | Sato |
| 6,490,713 B2 | 12/2002 | Matsumoto |
| 6,804,810 B1 | 10/2004 | Petersen et al. |

(Continued)

OTHER PUBLICATIONS

Non-Final Office Action for U.S. Appl. No. 13/289,965 mailed Mar. 28, 2014, 11 pages.

(Continued)

*Primary Examiner* — Helen Rossoshek
(74) *Attorney, Agent, or Firm* — Kilpatrick Townsend & Stockton LLP

(57) ABSTRACT

A computer implemented method for routing a net includes selecting, using one or more computer systems, a first spine routing track from a first multitude of routing tracks in accordance with a first cost function, and further in accordance with data associated with the net and the first multitude of routing tracks. The method further includes generating, using one or more computer systems, a first spine wire on the selected first spine routing track.

39 Claims, 6 Drawing Sheets

(56) References Cited

U.S. PATENT DOCUMENTS

| | | |
|---|---|---|
| 6,892,369 B2 | 5/2005 | Tieg et al. |
| 6,931,610 B1 | 8/2005 | Buch et al. |
| 7,257,797 B1 | 8/2007 | Waller et al. |
| 7,281,233 B1 | 10/2007 | Sivasubramaniam |
| 7,506,289 B1 | 3/2009 | Chapman |
| 7,603,644 B2 | 10/2009 | Waller |
| 7,802,208 B1 | 9/2010 | Waller et al. |
| 7,823,113 B1 | 10/2010 | Waller et al. |
| 8,010,929 B2 | 8/2011 | Malhotra et al. |
| 8,099,700 B1 | 1/2012 | Waller et al. |
| 8,099,702 B2 | 1/2012 | Hou et al. |
| 8,151,232 B2 | 4/2012 | Huang et al. |
| 8,201,127 B1 | 6/2012 | Wang et al. |
| 8,271,929 B2 | 9/2012 | Laub |
| 8,332,793 B2 | 12/2012 | Bose |
| 8,402,414 B2 | 3/2013 | Tanisho et al. |
| 8,458,639 B2 | 6/2013 | Pandey et al. |
| 8,479,139 B1 | 7/2013 | Baldsdon et al. |
| 8,479,141 B1 | 7/2013 | Waller et al. |
| 8,516,159 B2 | 8/2013 | Ananthanarayanan et al. |
| 8,538,964 B2 | 9/2013 | Magdy et al. |
| 8,782,588 B2 * | 7/2014 | Chang et al. .......... 716/131 |
| 2003/0018947 A1 | 1/2003 | Teig et al. |
| 2006/0080632 A1 | 4/2006 | Ng et al. |
| 2006/0206848 A1 | 9/2006 | Teig et al. |
| 2006/0288323 A1 | 12/2006 | Birch |
| 2008/0005711 A1 | 1/2008 | Scheffer |
| 2008/0216040 A1 | 9/2008 | Furnish et al. |
| 2008/0256380 A1 | 10/2008 | Tsutsumi et al. |
| 2009/0217225 A1 | 8/2009 | Sunder et al. |
| 2009/0254874 A1 | 10/2009 | Bose |
| 2009/0327989 A1 | 12/2009 | Zhuoxiang |
| 2011/0209112 A1 | 8/2011 | Laub |
| 2012/0137264 A1 | 5/2012 | Chang et al. |
| 2012/0137265 A1 | 5/2012 | Chang et al. |
| 2012/0297354 A1 | 11/2012 | Scheffer |
| 2013/0135811 A1 | 5/2013 | Dunwoody et al. |
| 2013/0268905 A1 | 10/2013 | Pandey et al. |
| 2014/0033157 A1 | 1/2014 | Chang et al. |

OTHER PUBLICATIONS

Non-Final Office Action for U.S. Appl. No. 13/289,963, mailed on Nov. 9, 2012, 10 pages.
Non-Final Office Action for U.S. Appl. No. 13/289,965, mailed on Nov. 30, 2012, 12 pages.
Notice of Allowance for U.S. Appl. No. 13/289,963, mailed on Apr. 18, 2013, 7 pages.
Notice of Allowance for U.S. Appl. No. 13/289,965, mailed on Jun. 10, 2013, 8 pages.
Notice of Allowance for U.S. Appl. No. 13/289,963, mailed on Jun. 12, 2013, 6 pages.
Mo et al., "Fishbone: A Block-Level Placement and Routing Scheme", ISPD '03: Proceedings of the 2003 International Symposium on Physical Design, Publisher ACM, Apr. 2003, 6 pgs.
Zhang et al., "GDRouter: Interleaved Global Routing and Detailed Routing for Ultimate Routability", DAC '12, Proceedings of the 49th Annual Design Automation Conference, Publisher ACM, Jun. 2012, 6 pgs.
Non-Final Office Action for U.S. Appl. No. 14/043,619, mailed on Nov. 7, 2013, 13 pages.
Notice of Allowance for U.S. Appl. No. 13/289,963, mailed on Nov. 20, 2013, 10 pages.
Notice of Allowance for U.S. Appl. No. 14/043,619 mailed on Mar. 6, 2014.
Notice of Allowance for U.S. Appl. No. 13/289,965 mailed on Oct. 3, 2014, 11 pages.

* cited by examiner

400 ↴

MULTIPLE LEVEL SPINE ROUTING

CROSS-REFERENCES TO RELATED APPLICATIONS

This application is a continuation of commonly assigned U.S. Non-Provisional application Ser. No. 13/289,965 titled "Multiple Level Spine Routing" filed Nov. 4, 2011, which claims priority to commonly assigned U.S. Provisional Application No. 61/417,839 filed Nov. 29, 2010, the contents of all of which are incorporated herein by reference in their entirety. The present application is related to commonly assigned U.S. patent application Ser. No. 14/043,619 titled "Multiple Level Spine Routing" filed Oct. 1, 2013, which is a continuation of U.S. patent application Ser. No. 13/289,963 titled "Multiple Level Spine Routing" filed Nov. 4, 2011, which claims priority to commonly assigned U.S. Provisional Application No. 61/417,839 filed Nov. 29, 2010, the contents of all of which are incorporated herein by reference in their entirety.

BACKGROUND

Existing one-level spine routing techniques are typically performed one net at a time and thus often result in suboptimal routing of integrated circuits. Improved spine routing techniques would be useful.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims, and the invention encompasses numerous alternatives, modifications, and equivalents. Numerous specific details are set forth in the following description in order to provide a thorough understanding of the invention. These details are provided for the purpose of example, and the invention may be practiced according to the claims without some or all of these specific details. For the purpose of clarity, technical material that is known in the technical fields related to the invention has not been described in detail so that the invention is not unnecessarily obscured.

Generally, a net of an integrated circuit design comprises a wiring connection that carries a signal from a driving cell to a receiving cell. A netlist specifies the locations of the output pins comprising a net in an integrated circuit design, and these locations of the output pins are typically fixed prior to routing. The wiring of the output pins comprising a net during routing defines the implementation of the net. The output pins and/or wiring connections associated with a particular net may be distributed across one or more (metal) layers of an integrated circuit design.

Various techniques and styles exist for routing an integrated circuit design. Spine routing, also known as fishbone routing, provides many advantages over other routing techniques. For example, spine routing can reduce vias and jogs on interconnects and can result in better routing quality in terms of factors such as timing delay and signal integrity.

Figure 1:
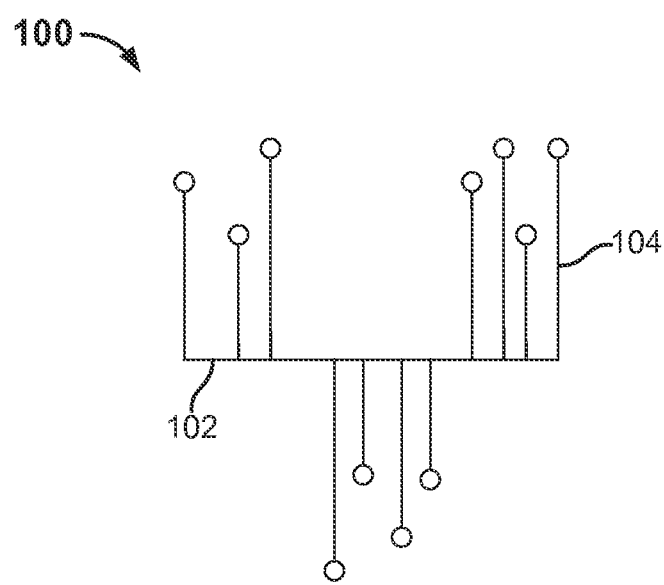
FIG. 1 illustrates a typical prior art spine routing result for a single net.

In existing spine routing techniques, a main spine assignment to each of a plurality of nets comprising an integrated circuit design is typically serially performed one net at a time. In some such cases, a heuristic approach in which nets are ranked and assigned main spines based on an order of importance of the nets may be employed. Existing spine routing techniques typically comprise one-level spine routing. FIG. 1 illustrates a typical prior art spine routing result for a single net 100. In the given example, main spine 102 runs horizontally. Once a main spine 102 has been selected for a particular net 100, each pin of the net (represented by circles in FIG. 1) is directly connected to main spine 102 by stitching spines such as stitching spine 104.

Improved spine routing techniques are disclosed herein. In some embodiments, multiple-level spine routing is employed. That is, more than one level of spine routing is employed. In some embodiments, a systematic approach for routing a plurality of nets is employed that at least in part optimizes the assignment of spines to nets and/or groups thereof. One or more of the disclosed techniques may be employed to obtain an improved integrated circuit topology in which one or more factors such as total wire lengths, propagation delays, skew times, etc., are improved compared to conventional routing solutions. Although in some of the provided examples horizontal and/or vertical routing of spines is described, the techniques disclosed herein may be similarly employed for any other spine orientations. Moreover, although two-level spine routing is described in some of the examples provided herein, the disclosed techniques may be similarly extended to any number of levels of spine routing.

Figure 2A:
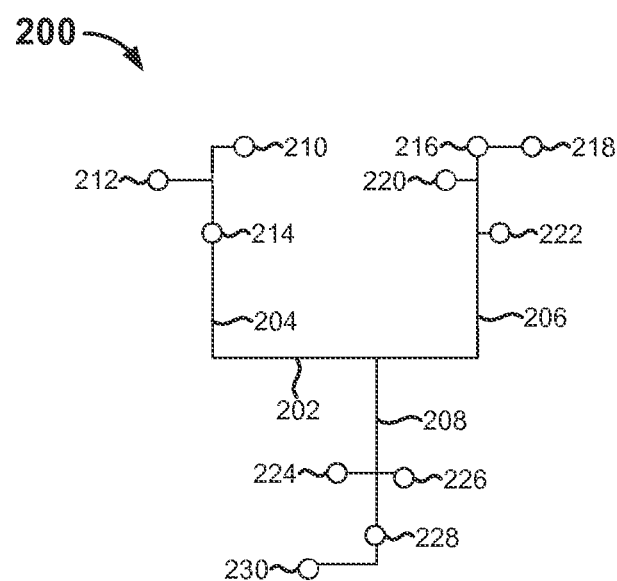
FIG. 2A illustrates an embodiment of two-level spine routing for a single net.

FIG. 2A illustrates an embodiment of two-level spine routing for a single net 200. In this example, main spine 202 runs horizontally. The pins (represented by circles in FIG. 2A) of net 200, however, do not connect directly to main spine 202.

Instead, the pins of net 200 are partitioned into groups, and a second level spine 204-208 is shared by each group. In this example, second level spines 204-208 run substantially perpendicular or orthogonal to main spine 202. Specifically, second level spine 204 is assigned to the group comprising pins 210-214, second level spine 206 is assigned to the group comprising pins 216-222, and second level spine 208 is assigned to the group comprising pins 224-230. Each pin 210-230 of net 200 is connected to the second level spine 204-208 assigned to its group. Although in the given example, main spine 202 is horizontal and second level spines 204-208 are vertical, in other embodiments, the main spine may be vertical and the second level spines may be horizontal.

In general, the total wire length of a net is computed by summing the wire lengths of all spines and the wire lengths connecting pins comprising the net to corresponding spines. For two-level spine routing, for instance, the total wire length of a net is computed by summing the length of the main spine, the lengths of all second level spines, and the lengths from each pin comprising the net to a corresponding second level spine. With respect to net 200 of FIG. 2A, for example, the total wire length of net 200 is the sum of the length of main spine 202, the lengths of second level spines 204-208, the lengths between each of pins 210-214 and second level spine 204, the lengths between each of pins 216-222 and second level spine 206, and the lengths between each of pins 224-230 and second level spine 208.

In some embodiments, as described above with respect to FIG. 2A, the pins comprising a net are partitioned into one or more groups. Pins may be partitioned into groups in a manner that strives to minimize the total wire length of the net. Any one or more appropriate statistical techniques may be employed to partition the pins comprising a net into groups. For example, the k-means clustering algorithm may be employed to partition pins into groups. In the k-means clustering algorithm, a given set of n observations $(x_1, x_2, \ldots, x_n)$, wherein each observation comprises a d-dimensional vector, is partitioned into $k \leq n$ sets $S = \{S_1, S_2, \ldots, S_k\}$ so as to minimize the within-cluster sum of squares as given by the following equation, wherein $\mu_i$ is the mean of the points in $S_i$:

$$\arg\min S \Sigma_{i=1}^{k} \Sigma_{x_j \in S_i} \|x_j - \mu_i\|^2$$

For spine routing, the pin locations of a net are fixed prior to routing and comprise the set of observations. In this case, each observation or pin position comprises a one-dimensional vector (i.e., d is 1) whose value specifies pin position relative to a spine to which the pin is to be directly connected. In the example of FIG. 2A in which the main spine is horizontal, only the x-coordinates of the pins need to be considered to determine the optimal x-coordinates of the vertical second level spines. In contrast, in embodiments in which the main spine is vertical, only the y-coordinates of the pins need to be considered to determine optimal y-coordinates of horizontal second level spines.

In some embodiments, the pins comprising a net are partitioned into groups based on a modified k-means clustering algorithm. Such an algorithm may at least in part be empirically or heuristically determined. In some cases, for example, a better result for total wire length may be obtained by using median instead of mean values and/or partitioning pins into groups such that the pins in each group all fall on the same side of the main spine, i.e., pins on opposite sides of the main spine are not partitioned into the same group. In some such cases, the pin partitioning problem is modeled as a one-dimensional k-median clustering problem with the constraint that pin locations relative to the main spine are taken into consideration such that pins in each group are positioned on the same side of the main spine. Any one or more well-known statistical algorithms, such as Lloyd's algorithm, may be employed to solve this problem. In some embodiments, an exhaustive search is performed to find the optimal number of groups, k, by varying k from 1 to the number of pins. In such cases, when k is 1, all pins of a net are put into a single group; and when k is the number of pins, each pin of the net is put into a distinct group of its own.

Figure 2B:
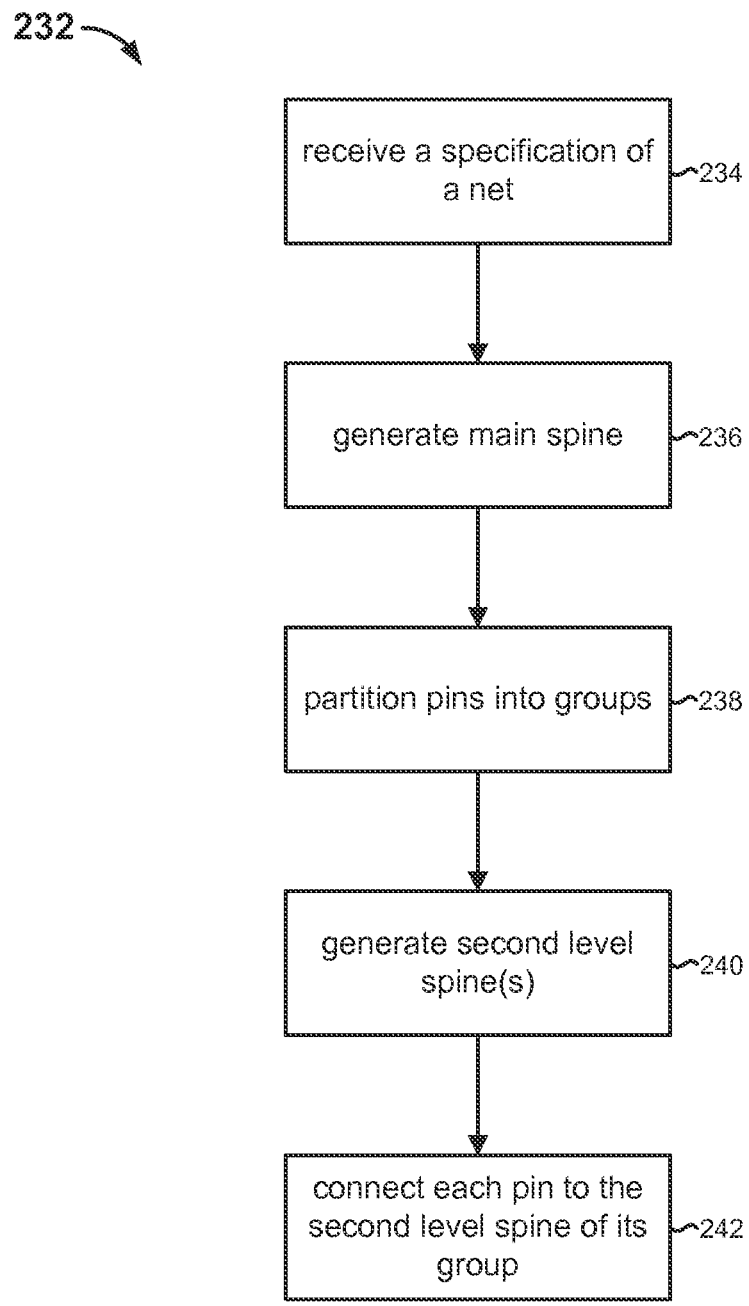
FIG. 2B is a flow chart illustrating an embodiment of a process for routing a net.

FIG. 2B is a flow chart illustrating an embodiment of a process for routing a net. In some embodiments, process 232 is employed to generate the two-level spine routing of net 200 of FIG. 2A. Process 232 starts at step 234 at which a specification of a net is received. In some embodiments, the specification of the net comprises locations or positions of a set of pins comprising the net. In some embodiments, the specification comprises a netlist and/or an output of a placer. At step 236, a main spine is generated for the net. For example, a main spine wire is generated. In some embodiments, step 236 includes selecting a track for the main spine from a plurality of available main spine tracks. At step 238, the set of pins comprising the net are partitioned into one or more groups based at least in part on a cost function. Pin partitioning may be based at least in part on a statistical algorithm such as a k-means clustering algorithm or a k-median clustering algorithm. In some embodiments, the cost function is based at least in part on wire lengths. Pins may be partitioned based on the position of the main spine, for example, so that pins of each group are located on the same side of the main spine. At step 240, a second level spine that connects to the main spine is generated for each group of the net. For example, second level spine wires are generated. In some embodiments, the locations or positions of the second level spines are based at least in part on the pin partitioning of step 238. Likewise, the partitioning of pins at step 238 may be based at least in part on available tracks for the second level spines. In some embodiments, step 240 includes selecting tracks for the second level spines from a plurality of available second level spine tracks. At step 242, each pin of each group of the net is connected to the second level spine of its group. In some embodiments, various factors (e.g., existing components or structures that cannot be repositioned, design rule limitations, etc.) may constrain the positions or locations of the main spine wire, the second level spine wires, and the wires connecting pins to associated second level spines.

Figure 3:
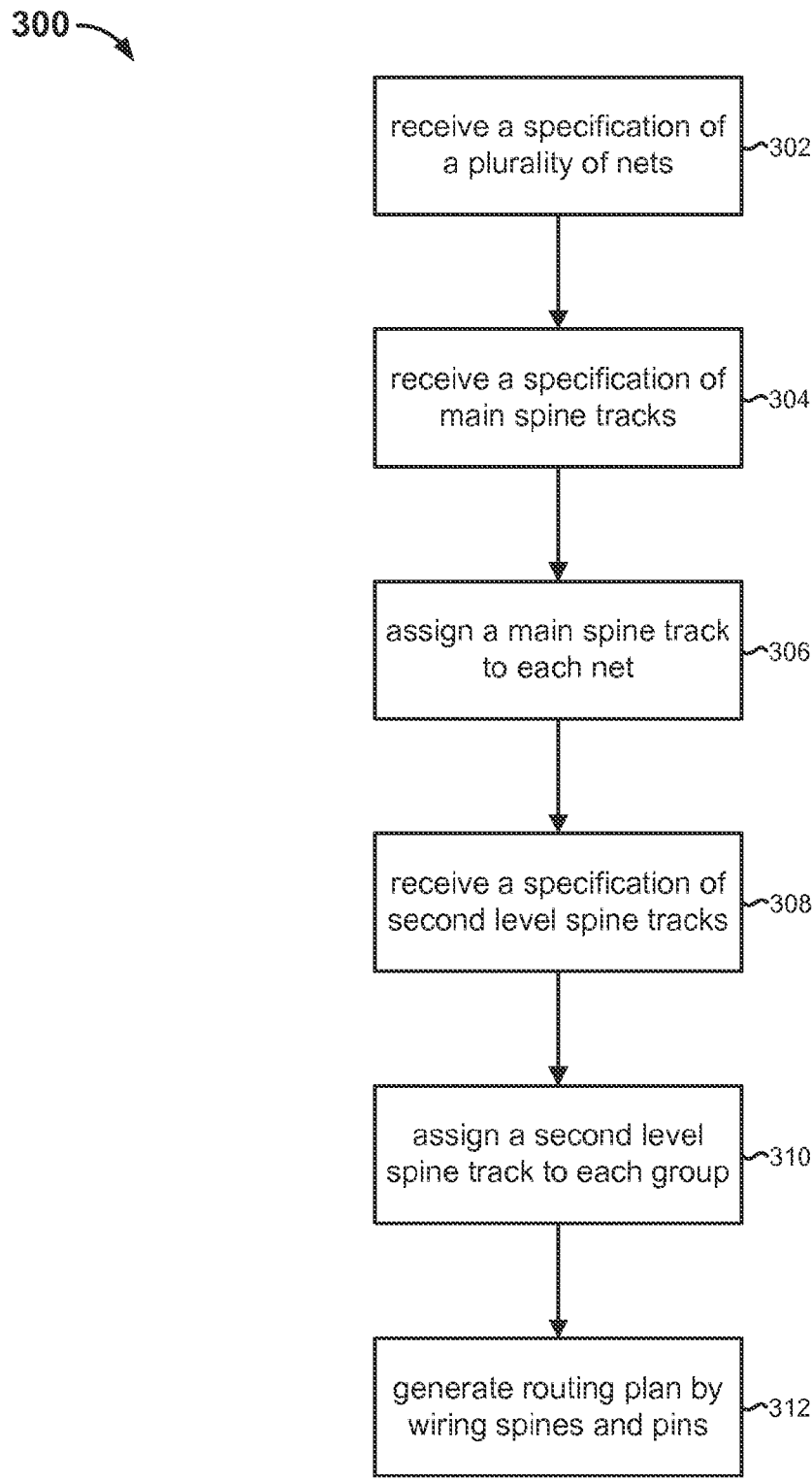
FIG. 3 is a flow chart illustrating an embodiment of a process for generating a routing plan.

FIG. 3 is a flow chart illustrating an embodiment of a process for generating a routing plan. Process 300 may be employed, for example, to generate a routing plan for an integrated circuit or portion thereof. That is, process 300 may be employed to systematically route a plurality of nets by assigning locations to one or more levels of spines, for example, in a manner that minimizes the total wire length of the set of nets to the extent possible. Process 300 starts at step 302 at which a specification of a plurality of nets is received. The plurality of nets comprises an integrated circuit design or portion thereof. In some cases, the specification of the plurality of nets comprises a netlist and/or the output of a placer. At step 304, a specification of a set of tracks to which main spines may be assigned is received. Positions of the set of tracks may be based on design rules and/or user specifications.

Given a set of nets to be routed at step 302 and a set of tracks to which main spines can be assigned at step 304, a main spine track is assigned to each of the set of nets at step 306. Each main spine track is assigned to at most a single net. Main spine tracks are assigned to nets based at least in part on a cost function, for example, that minimizes the total wire length for the set of nets to the extent possible. In some embodiments, the total wire length of a net with respect to each of at least a subset of main spine tracks is computed, and an optimal track assignment is selected based on such computations. For example, if a set of N nets need to be routed and main spines can be assigned to M possible tracks, an N×M matrix is in some cases generated in which entries represent the total wire length for a particular net assigned to a particular track. In such cases, the track assignments that minimize overall cost (e.g., total wire length) across all nets may be selected.

In some embodiments, computing the total wire length of a net with respect to a particular track includes first partitioning the pins of the net into an optimal number of groups based on the position or location of the track using the techniques for pin partitioning described above. That is, in some cases, the same pin partitioning may not be optimal or even applicable for different main spine tracks since the relative pin positions of a net with respect to different main spine tracks depends on the locations or positions of the main spine tracks. For example, some pins of a net that are located on a particular side of one main spine track may be located on the opposite side of a different main spine track. As such, pin partitioning into groups may need to be performed for each or at least each of a subset of available main spine tracks to obtain more accurate estimates of total wire lengths. Moreover, the total wire lengths computed may comprise estimates based on optimal second level spine locations or positions determined using the algorithms described above with respect to pin partitioning. The actual total wire lengths may differ based on restrictions on available positions for the second level spines in the design.

Figure 4:
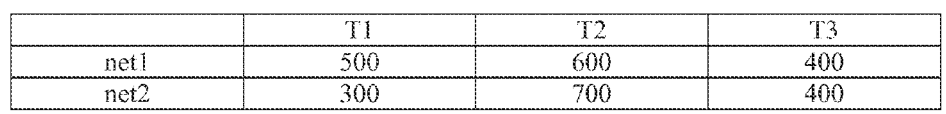
FIG. 4 illustrates an embodiment of a matrix used for determining main spine track assignments for nets.

FIG. 4 illustrates an embodiment of a matrix used for determining main spine track assignments for nets. In the given example, each row of matrix 400 corresponds to a net, and each column of matrix 400 corresponds to a possible main spine track. Matrix 400 includes total wire length entries for two nets (i.e., net1 and net2) with respect to three possible main spine tracks (i.e., T1, T2, and T3). In some embodiments, one or more of the total wire length entries are estimates. As depicted, when track T1 is assigned to net1, the total wire length is 500; when track T2 is assigned to net1, the total wire length is 600; and when track T3 is assigned to net1, the total wire length is 400. Likewise, when tracks T1, T2, and T3 are assigned to net2, the total wire lengths are 300, 700, and 400, respectively. In this example, the optimal assignment is to assign track T3 to net1 and track T1 to net2, which results in an overall wire length of 700 (i.e., 400+300).

Mathematically, the problem of determining an optimal track to net assignment using a matrix such as matrix 400 can be modeled as a linear assignment problem and solved using any one or more well-known algorithms for solving linear assignment problems. With respect to a matrix having a structure such as matrix 400, for example, the linear assignment problem can be formally defined as follows: given a matrix with R rows and C columns, for each row r, find a unique column c such that the sum of M(r, c) computed over all rows of the matrix is minimized, wherein M(r, c) denotes the value at row r column c in the matrix. Solving such a linear assignment problem entails finding an optimal assignment of tracks to nets such that each track is assigned to at most one net. The solution resulting from solving such a linear assignment problem comprises the main spine track assignments for the nets. Once a main spine track has been assigned to a net at step 306 of process 300, an optimal pin partitioning for that track and therefore the number of groups and second level spines for the net are known.

At step 308 of process 300 of FIG. 3, a specification of a set of tracks to which second level spines may be assigned is received. Positions of the set of tracks may be based on design rules and/or user specifications. In some embodiments, the second level spines are oriented substantially perpendicular or orthogonal to the main spines. At step 310, a second level spine track is assigned to each group of each net. A systematic approach similar to the approach for main spine track assignments may be employed for assigning second level spine tracks to groups of nets. That is, second level spine tracks may be assigned to groups based at least in part on a cost function, for example, that minimizes the total wire length for the set of nets to the extent possible. Optimal pin partitions of each net for a given main spine track assignment are known from when they were determined during step 306. However, in some cases, the pin partitions or groupings may be updated at step 310, for example, based on the actual available locations or positions of the second level spine tracks. Each group of a pin partition is assigned a second level spine. Thus, k second level spines are needed for a pin partition comprising k groups. If the entire set of nets under consideration comprises a total of K groups, K second level spines are needed for the set of nets.

In some embodiments, the total wire length for connecting the pins of a group to a second level spine and connecting that second level spine to the main spine of the associated net is computed for a group for each of at least a subset of second level spine tracks, and optimal second level spine track assignments are selected based on such computations. For example, if K groups exist for the entire set of nets under consideration and second level spines can be assigned to T possible tracks, a K×T matrix is in some cases generated in which entries represent the total wire length for a particular group assigned to a particular second level spine track. In such cases, the track assignments that minimize overall cost (e.g., total wire length) across all groups may be selected.

Figure 5:
FIG. 5 illustrates an embodiment of a matrix used for determining second level spine track assignments for groups of nets.

FIG. 5 illustrates an embodiment of a matrix used for determining second level spine track assignments for groups of the nets of FIG. 4. In the given example, each row of matrix 500 corresponds to a group of a net, and each column of matrix 500 corresponds to a possible second level spine track. After the main spines of net1 and net2 have been assigned as described with respect to FIG. 4, the pin partition for net1 results in three groups (i.e., net1.g1, net1.g2, and net1.g3) while the pin partition for net2 results in two groups (i.e., net2.g1 and net2.g2) as depicted in matrix 500. Matrix 500 includes wire length entries for each of the five groups (i.e., net1.g1, net1.g2, net1.g3, net2.g1, and net2.g2) with respect to six possible second level spine tracks (i.e., T1, T2, T3, T4, T5, and T6). Similar to the main spine assignment problem, the second level spine assignment problem can be modeled as a linear assignment problem and solved using any one or more well-known algorithms for solving linear assignment problems. An optimal solution to such a problem results in second level spine track assignments that minimize the sum of total wire lengths for the set of nets. For the example of FIG. 5, an optimal solution comprises track assignments as follows: net1.g1 on T4 (wire length=30), net1.g2 on T2 (wire length=30), net1.g3 on T5 (wire length=50), net2.g1 on T1 (wire length=40), and net2.g2 on T6 (wire length=40).

At step 312 of process 300 of FIG. 3, a routing plan is generated by wiring the spines and pins. Main spines are generated based on the track assignment results of step 306, second level spines are generated based on the track assignment results of step 310, and each pin is wired or connected to its corresponding second level spine to generate the routing plan at step 312.

As described, the disclosed techniques may be systematically employed to assign positions to spines of an integrated circuit or portion thereof in a manner that optimizes or at least attempts to reduce or minimize the consumption of routing resources so that an improved integrated circuit topology can be achieved. The disclosed techniques may be employed to reduce or minimize the total amount of routing wire, propagation delays, skew times, etc., of a design. Although two-level spine routing is described in the examples of FIGS. 2-5, the disclosed techniques may be analogously employed with respect to any number of levels of spine routing. Furthermore, the disclosed techniques may be employed to optimize an entire integrated circuit or a portion thereof.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A computer implemented method for routing a net, comprising:
    selecting, using one or more computer systems, a first spine routing track from a first plurality of routing tracks, wherein the selecting is based on:
        data associated with the net,
        data associated with the first plurality of spine routing tracks,
        a first cost function, and
        a solution to a Linear Assignment Problem; and
    generating, using one or more computer systems, a first spine wire on the selected first spine routing track.

2. The method of claim 1, wherein the net is a net of an integrated circuit design.

3. The method of claim 1, wherein the Linear Assignment Problem uses one or more of the first plurality of routing tracks.

4. The method of claim 1, wherein the first cost function includes a wire length.

5. The method of claim 1, wherein selecting, using the one or more computer systems, includes partitioning a plurality of pins associated with the net into one or more groups of pins in accordance with a second cost function.

6. The method of claim 5, wherein the second cost function includes a wire length.

7. The method of claim 5, wherein the first cost function includes the second cost function.

8. The method of claim 5, wherein partitioning, using the one or more computer systems, includes using a position of the selected first spine routing track.

9. The method of claim 5, wherein one of the one or more groups of pins are partitioned on a same side of the selected first spine routing track.

10. The method of claim 5, wherein partitioning, using the one or more computer systems, includes partitioning in accordance with a k-means clustering or a k-median clustering.

11. The method of claim 5 further comprising selecting, using the one or more computer systems, a second spine routing track from a second plurality of routing tracks associated with one of the one or more groups of pins in accordance with a third cost function, and further in accordance with data associated with the second plurality of routing tracks.

12. The method of claim 11, wherein the third cost function includes a wire length.

13. The method of claim 11, wherein selecting, using the one or more computer systems, a second spine routing track includes solving a Linear Assignment Problem.

14. The method of claim 11, wherein selecting, using the one or more computer systems, a second spine routing track includes solving a Linear Assignment Problem using one or more of the second plurality of routing tracks.

15. The method of claim 11 further comprising generating, using the one or more computer systems, a second spine wire on the selected second spine routing track.

16. The method of claim 15 further comprising generating, using the one or more computer systems, a wire from a pin of one of the one or more groups of pins to the second spine wire.

17. The method of claim 11, wherein one or more of the first cost function, the second cost function, and the third cost function are the same.

18. The method of claim 11, wherein the second spine routing track is oriented substantially orthogonal to the first spine routing track.

19. A system for routing a net, comprising:
    a processor; and
    a memory storing a set of instructions which when executed by the processor configures the processor to:
        select a first spine routing track from a first plurality of routing tracks, wherein the selecting is based on:
            data associated with the net,
            data associated with the first plurality of spine routing tracks,
            a first cost function, and
            a solution to a Linear Assignment Problem; and
            generate a first spine wire on the selected first spine routing track.

20. The system of claim 19, wherein the Linear Assignment Problem uses one or more of the first plurality of routing tracks.

21. The system of claim 19, wherein the first cost function includes a wire length.

22. The system of claim 19, wherein to select the first spine routing track includes partitioning a plurality of pins associated with the net into one or more groups of pins in accordance with a second cost function.

23. The system of claim 22, wherein the second cost function includes a wire length.

24. The system of claim 22, wherein the first cost function includes the second cost function.

25. The system of claim 22, wherein the processor is further configured to select a second spine routing track from a second plurality of routing tracks associated with one of the one or more groups of pins in accordance with a third cost function, and further in accordance with data associated with the second plurality of routing tracks.

26. The system of claim 25, wherein the third cost function includes a wire length.

27. The system of claim 25, wherein to select a second spine routing track includes solving a Linear Assignment Problem using one or more of the second plurality of routing tracks.

28. The system of claim 25, wherein the processor is further configured to generate a second spine wire on the selected second spine routing track.

29. The system of claim 28, wherein the processor is further configured to generate a wire from a pin of one of the one or more groups of pins to the second spine wire.

30. The system of claim 25, wherein one or more of the first cost function, the second cost function, and the third cost function are the same.

31. The system of claim 25, wherein the second spine routing track is oriented substantially orthogonal to the first spine routing track.

32. A non-transitory computer-readable medium storing computer-executable code for routing a net, the non-transitory computer-readable medium comprising:

code for selecting, using one or more computer systems, a first spine routing track from a first plurality of routing tracks, wherein the selecting is based on:
data associated with the net,
data associated with the first plurality of spine routing tracks,
a cost function, and
a solution to a Linear Assignment Problem; and
code for generating, using one or more computer systems, a first spine wire on the selected first spine routing track.

33. The non-transitory computer-readable medium of claim 32, wherein the cost function includes a wire length.

34. The non-transitory computer-readable medium of claim 32, wherein the code for selecting includes code for partitioning a plurality of pins associated with the net into one or more groups of pins in accordance with a second cost function.

35. The non-transitory computer-readable medium of claim 34, wherein the second cost function includes a wire length.

36. The non-transitory computer-readable medium of claim 34, further comprising code for selecting a second spine routing track from a second plurality of routing tracks associated with one of the one or more groups of pins in accordance with a third cost function, and further in accordance with data associated with the second plurality of routing tracks.

37. The non-transitory computer-readable medium of claim 36, wherein the third cost function includes a wire length.

38. The non-transitory computer-readable medium of claim 36, further comprising code for generating a second spine wire on the selected second spine routing track.

39. The non-transitory computer-readable medium of claim 38, further comprising code for generating a wire from a pin of one of the one or more groups of pins to the second spine wire.

* * * * *